(12) United States Patent
Kula et al.

(10) Patent No.: US 11,380,839 B2
(45) Date of Patent: Jul. 5, 2022

(54) MAGNETIC MEMORY CELL HAVING DETERMINISTIC SWITCHING AND HIGH DATA RETENTION

(71) Applicants: ANTAIOS, Meylan (FR); Centre National de la Recherche Scientifique, Paris (FR); Commissariat à l'Energie Atomique et aux Energies Alternatives, Paris (FR)

(72) Inventors: Witold Kula, Gilroy, CA (US); Marc Drouard, Valence (FR); Gilles Gaudin, Corenc (FR); Jean-Pierre Nozieres, Le Sappey-en-Chartreuse (FR)

(73) Assignees: Antaios, Meylan (FR); Centre National De La Recherche Scientifique, Paris (FR)

( * ) Notice: Subject to any disclaimer, the term of this patent is extended or adjusted under 35 U.S.C. 154(b) by 83 days.

(21) Appl. No.: 16/865,348

(22) Filed: May 2, 2020

(65) Prior Publication Data
US 2020/0357982 A1 Nov. 12, 2020

(30) Foreign Application Priority Data
May 6, 2019 (EP) .................................. 19315030

(51) Int. Cl.
*H01L 43/04* (2006.01)
*H01L 27/22* (2006.01)
*H01L 43/06* (2006.01)

(52) U.S. Cl.
CPC ............ *H01L 43/04* (2013.01); *H01L 27/222* (2013.01); *H01L 43/06* (2013.01)

(58) Field of Classification Search
CPC ....... H01L 43/04; H01L 27/222; H01L 43/06; G11C 11/1659; G11C 11/1675
(Continued)

(56) References Cited

U.S. PATENT DOCUMENTS

| 2006/0126371 A1* | 6/2006 | Nagase | .................. G11C 11/16 365/145 |
| 2006/0152969 A1* | 7/2006 | Trouilloud | .............. G11C 11/16 365/171 |

(Continued)

FOREIGN PATENT DOCUMENTS

WO WO-2017/044132 A1 3/2017

OTHER PUBLICATIONS

Wang et al., Evaluation of Ultrahigh-Speed Magnetic Memories Using Field-Free Spin-Orbit Torque, Mar. 15, 2018, pp. 1-5 (Year: 2018).*

*Primary Examiner* — Duy T Nguyen
(74) *Attorney, Agent, or Firm* — Blank Rome LLP (57) ABSTRACT

A magnetic memory (MRAM) cell, comprising: a first layer formed from a substantially electrically conductive material; and a magnetic tunnel junction (MTJ) stack formed over the first layer, wherein the MTJ stack comprises: a ferromagnetic reference layer having an in-plane reference magnetization; a tunnel barrier layer; and a ferromagnetic storage layer between the tunnel barrier layer and the first layer, the storage layer having an in-plane storage magnetization; wherein the MTJ stack comprises an arrangement for providing an in-plane uniaxial anisotropy in the storage layer; wherein said in-plane uniaxial anisotropy makes an angle with the direction of the write current that is between 5° and 90°, and wherein said in-plane uniaxial anisotropy has an energy between 40 and 200 kBT and wherein coercivity is larger than 200 Oe.

13 Claims, 5 Drawing Sheets

(58) Field of Classification Search
USPC .......................................................... 257/427
See application file for complete search history.

(56) References Cited

U.S. PATENT DOCUMENTS

| | | | |
|---|---|---|---|
| 2007/0278547 A1* | 12/2007 | Pietambaram | H01L 43/08 |
| | | | 257/296 |
| 2011/0170339 A1 | 7/2011 | Wunderlich et al. | |
| 2012/0314488 A1 | 12/2012 | El Baraji et al. | |
| 2014/0111195 A1* | 4/2014 | Kuo | H01L 21/00 |
| | | | 324/252 |
| 2017/0125078 A1 | 5/2017 | Mihajlovic et al. | |
| 2017/0330070 A1* | 11/2017 | Sengupta | H01L 43/08 |

* cited by examiner

MAGNETIC MEMORY CELL HAVING DETERMINISTIC SWITCHING AND HIGH DATA RETENTION

RELATED APPLICATION

This application claims the benefit of European Application No. EP19315030, filed on May 6, 2019. The entire content of this application is hereby incorporated by reference.

FIELD

The present invention concerns a magnetic memory cell having deterministic switching, high data retention and high immunity to magnetic field disturbance.

DESCRIPTION OF RELATED ART

A non-volatile magnetic random-access memory (MRAM) cell includes a magnetic tunnel junction (MTJ) having a magnetically hard layer (i.e., a "reference" layer) and a magnetically soft layer (i.e., the "free" or "storage" layer) and a tunnel barrier layer between the reference layer and the storage layer. Conventional MRAM cells can be written by passing current through current leads that are formed on either side of each memory element in order to create a local induced magnetic field, which sets the direction of the soft layer magnetization.

Spin transfer torque (STT) MRAM cells are similar to conventional MRAM cells except that the write current path passes perpendicularly through the magnetic layers of the MTJ and through the tunnel barrier of the MTJ. The storage layer is set via the spin transfer torque from the spin polarized current induced by the reference magnetic layer.

Recently, an alternative way to switch the magnetization of a thin ferromagnetic layer using an electric current has been demonstrated based on the concept of the spin-orbit torque (SOT). In this scheme, the magnetic storage layer is in contact with a SOT-generating stripe (layer), typically Pt, Ta, W, Hf, IrMn or PtMn. When injecting a current in the nonmagnetic SOT generating layer, the spin-orbit coupling leads either to a perpendicular spin current inside the SOT generating layer as well as a spin accumulation at the interface with the magnetic material. Both effects lead to a transfer of angular momentum to the magnetization of the ferromagnetic layer, creating spin orbit torques and inducing magnetization reversal in the ferromagnetic layer. The spin current generation is referred to as spin Hall effect while the spin reorientation is commonly linked to the Rashba effect. Their relative contribution and more generally the precise physical mechanism is currently under debate.

A key advantage of the SOT-MRAM cell is that the write and read operations are decoupled due to the different current paths, which naturally solves the problems related to endurance and read disturbance of the STT-MRAM. Moreover, the TMR can be tuned independently of writing constraints, relaxing the RA requirements (typically in STT-MRAM RA<10 $\Omega\mu m^2$) in order to achieve high TMR (>200%).

Figure 1A:
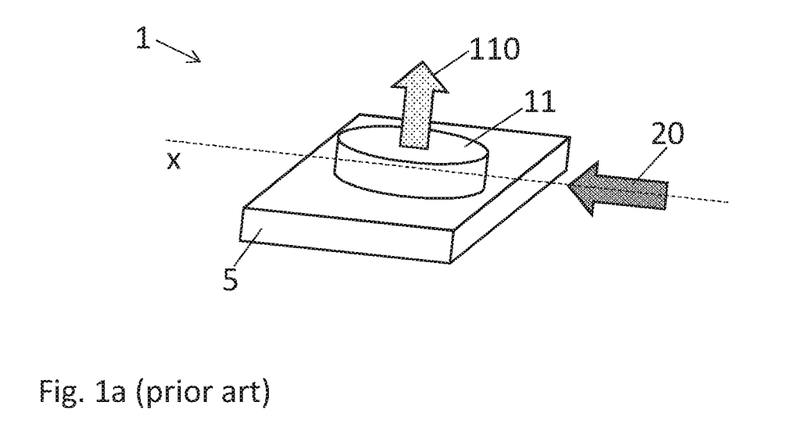
Figure 1B:
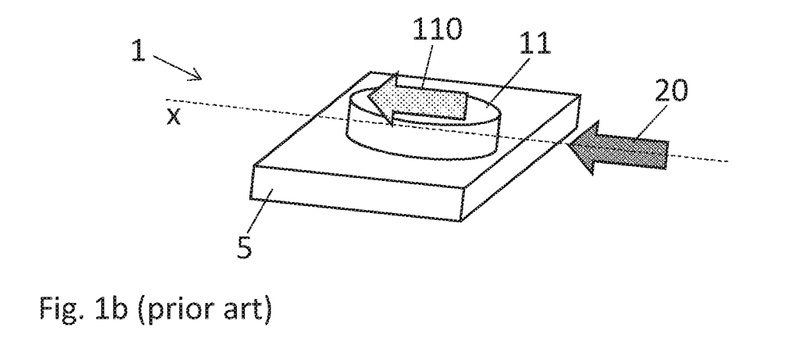
Figure 1C:
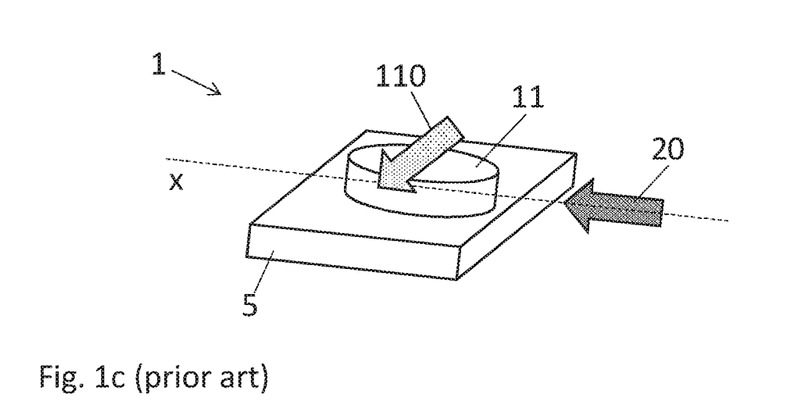

A spin-orbit torque switching for various SOT-MRAM cell configurations is schematically illustrated in FIGS. 1a-c. In the figures, the SOT-MRAM cell is only represented by the storage layer 11 adjacent to a bottom electrode 5 (SOT-generating stripe). A current 20 is passed in the bottom electrode 5.

In FIG. 1a, the bit storage layer 11 comprises an out-of-plane storage magnetization 110, i.e., the storage magnetization 110 is oriented substantially perpendicular to the plane of the storage layer 11.

The storage layer 11 further presents a strong magnetic anisotropy such that sufficient data retention (at least a few seconds) is also achieved.

However, the spin orbit torques generated by the current 20 do not allow for a deterministic switching as both magnetic orientations (up and down) of the storage magnetization 110 are symmetrical for these torques and none of these two magnetic orientations are favored. In order to establish a determined switched orientation of the storage magnetization 110, an additional symmetry-breaking factor is required, such as an additional external magnetic field (not shown) being at least partly aligned in the direction of the current 20.

FIG. 1b shows a configuration of the SOT-MRAM cell 1 where the storage layer 11 comprises an in-plane storage magnetization 110, i.e., the storage magnetization 110 is oriented substantially parallel to the plane of the storage layer 11. The storage magnetization 110 is oriented substantially collinear to the current direction so that the current induced SOT is maximized and a fast switching can be achieved. As the spin orbit torques induced by the current 20 act symmetrically on the two orientations of the storage magnetization 110 (parallel and antiparallel to the current direction), the current 20 does not allow for a deterministic switching unless an additional symmetry breaking factor is provided, such as an additional external magnetic field (not shown) being at least partly oriented substantially perpendicular to the plane of the storage layer 11.

In FIG. 1c, the storage layer 11 of the SOT-MRAM cell 1 comprises an in-plane storage magnetization 110 oriented substantially perpendicular to the direction of the current 20. In this configuration, the action of the spin orbit torques is not symmetrical for the two orientations of the storage magnetization 110, such that a deterministic switching of the storage magnetization 110 can be achieved without any additional symmetry-breaking factor.

The configurations of FIGS. 1b and 1c with the in-plane storage magnetization 110 typically rely on shape anisotropy and do not present a coercivity that is large enough (>500 Oe) to ensure immunity against magnetic disturbances.

The configurations of FIGS. 1b and 1c with the in-plane storage magnetization 110 show a weak magnetic anisotropy so that sufficient data retention cannot be achieved in small sized cells, i.e., typically with largest dimension being below 60 nm.

Publication "Evaluation of Ultrahigh-speed Magnetic Memories Using Field-Free Spin-Orbit Torque", by Wang Zhaohao et al, evaluates the potential of two types of SOT-MRAMs, whose data can be ultrafast written based on known field-free SOT mechanisms. A cross-layer analysis is presented involving device modeling, circuit-level optimization, and architecture-level evaluation. First, the principle of the magnetization switching is analyzed with the macrospin simulation. Then, the optimization strategies at the circuit level are generalized through the SPICE-type simulation. Finally, the memory architecture with the SOT-MRAMs, STT-MRAM, and static RAM is built. Their read/write performances are evaluated with NVSim software. It is demonstrated that one of the studied SOT-MRAMs shows the promising prospect in the non-volatile memory, especially suitable for high-capacity cache.

Publication "Micromagnetic Simulation of Spin-Orbit Torque Induced Ultrafast Switching of In-Plane Magnetization" by Li Zuwei et al, teaches that, through micromagnetic simulation, the in-plane magnetization can be ultrafast and reliably switched by two methods. First, enhancing the field-like torque can eliminate the incubation delay to accelerate the magnetization switching. Second, tilting the easy-axis can strengthen the initial spin torque to decrease the switching delay. These two switching mechanisms are analyzed in this publication based on micromagnetic simulation results.

US2017/125078 discloses a method and apparatus for deterministically switching a free layer in a spin orbit torque magnetoresistive random access memory (SOT-MRAM) cell is disclosed herein. In one embodiment, an SOT-MRAM memory cell is provided. The SOT-MRAM memory cell includes a magnetic tunnel junction, a ferromagnetic bias layer, and an antiferromagnetic layer. The magnetic tunnel junction includes a free layer having primarily two bi-stable magnetization directions, a reference layer having a fixed magnetization direction, and an insulating tunnel barrier layer positioned between the free layer and the reference layer. The ferromagnetic bias layer is configured to provide spin orbit torque via anomalous Hall effect and simultaneously configured to provide a magnetic bias field on the free layer to achieve deterministic switching. The antiferromagnetic layer is positioned below the ferromagnetic bias layer and is configured to pin a magnetization direction of the ferromagnetic bias layer in a predetermined direction.

US2011/170339 discloses a method of operating a magnetoresistive device. The device comprises a ferromagnetic region configured to exhibit magnetic anisotropy and to allow magnetisation thereof to be switched between at least first and second orientations and a gate capacitively coupled to the ferromagnetic region. The method comprises applying an electric field pulse to the ferromagnetic region so as to cause orientation of magnetic anisotropy to change for switching magnetisation between the first and second orientations.

US 2012/314488 discloses a magnetic random access memory (MRAM) cell which includes a storage layer, a sense layer, and a spacer layer between the storage layer and the sense layer. A field line is magnetically coupled to the MRAM cell to induce a magnetic field along a magnetic field axis, and at least one of the storage layer and the sense layer has a magnetic anisotropy axis that is tilted relative to the magnetic field axis. During a write operation, a storage magnetization direction is switchable between m directions to store data corresponding to one of m logic states, with m>2, where at least one of the m directions is aligned relative to the magnetic anisotropy axis, and at least another one of the m directions is aligned relative to the magnetic field axis. During a read operation, a sense magnetization direction is varied, relative to the storage magnetization direction, to determine the data stored by the storage layer.

WO 2017/044132 discloses an apparatus which comprises, a substrate, and a magnet formed with one or more materials or a stack of materials with perpendicular magnetic anisotropy (PMA), wherein a magnetic moment of the magnet points mainly in a plane of the substrate. There is also disclosed a method comprising: defining a pitch grating pattern; transferring the pitch grating pattern into a backbone layer to form a patterned backbone layer; and depositing a layer of magnetic spacer, formed of one or more materials or a stack of materials of different metals or oxides, on the patterned backbone layer.

Therefore, there is still a need for a MRAM cell design providing all of the following features: fast switching, deterministic switching, sufficient data retention and large coercivity for sufficient immunity to magnetic field disturbance.

SUMMARY

The present disclosure concerns a magnetic memory (MRAM) cell, comprising: a first electrode formed from a substantially conductive layer, wherein the first electrode has a surface arranged to accumulate spin when a write current is flowed through the substantially conductive layer, in the plane of the first electrode; and a magnetic tunnel junction (MTJ) stack formed over the first electrode, wherein the MTJ stack comprises: a ferromagnetic reference layer having an in-plane reference magnetization; a tunnel barrier layer; and a ferromagnetic storage layer between the tunnel barrier layer and the first electrode, the storage layer having an in-plane storage magnetization; wherein the MTJ stack comprises an arrangement for providing an in-plane uniaxial anisotropy in the storage layer; wherein said in-plane uniaxial anisotropy makes an angle with the direction of the write current that is between 5° and 90°, and wherein said in-plane uniaxial anisotropy has an energy between 40 and 200 $k_B T$ and a coercive field above 1000 Oe.

The MRAM cell design provides all of the following features: fast switching, deterministic switching, sufficient data retention and large coercivity without an additional symmetry-breaking factor.

BRIEF DESCRIPTION OF THE DRAWINGS

The invention will be better understood with the aid of the description of an embodiment given by way of example and illustrated by the figures, in which:

FIG. 1 illustrates a MRAM cell configuration wherein a storage layer comprises an out-of-plane storage magnetization (FIG. 1a) or an in-plane storage magnetization (FIGS. 1b and c);

DETAILED DESCRIPTION OF POSSIBLE EMBODIMENTS

Figures 2, 3:
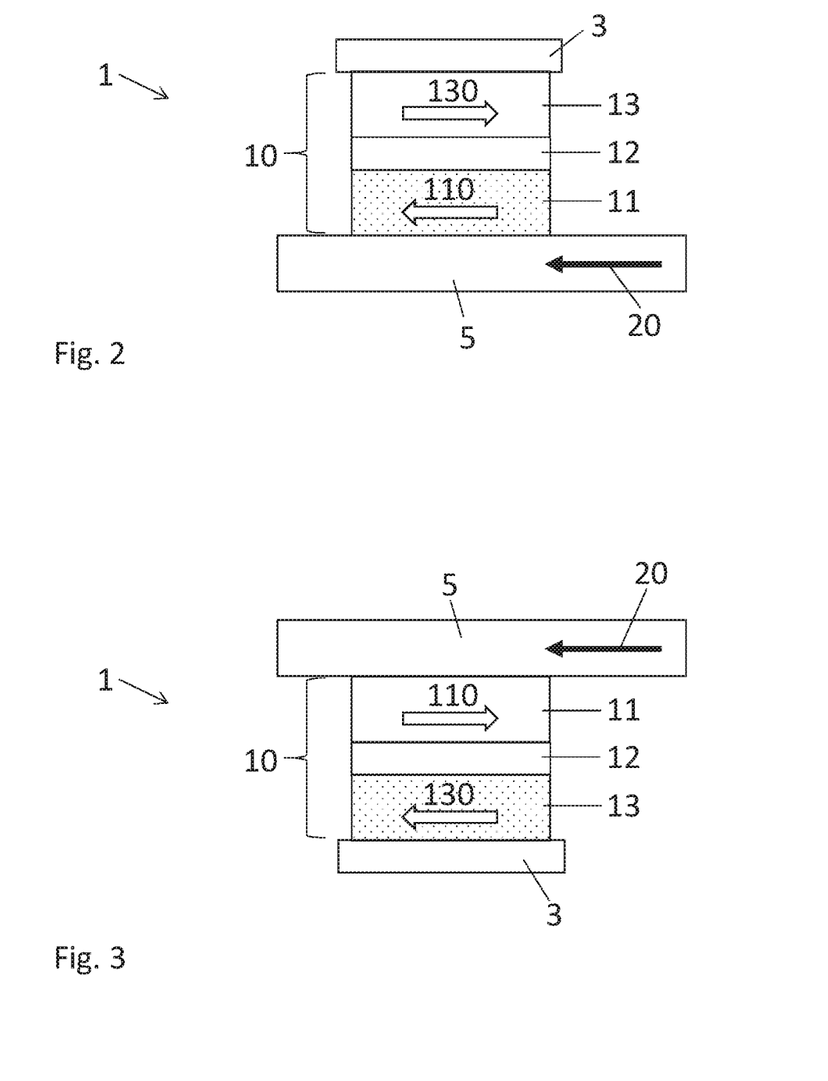
FIG. 2 shows a cross section view of a MRAM cell, according to an embodiment.
FIG. 3 shows a cross section view of a MRAM cell, according to another embodiment.

FIG. 2 shows a cross section view of a magnetic memory (MRAM) cell 1, according to an embodiment. The MRAM cell 1 comprises a first layer 5 configured for passing a write current 20. The MRAM cell 1 further comprises a magnetic tunnel junction (MTJ) stack 10 formed over the first layer 5. The MTJ stack 10 comprises: a ferromagnetic reference layer 13 having an in-plane reference magnetization 130, a tunnel barrier layer 12, and a ferromagnetic storage layer 11 having an in-plane storage magnetization 110. Here the expression "in-plane" signifies that the reference magnetization 130 and the storage magnetization 110 have stable states within the plane of the reference layer 13 and the storage layer 11, respectively.

The storage layer 11 is between the tunnel barrier layer 12 and the first layer 5. The tunnel barrier layer 12 is between the reference layer 13 and the storage layer 11. The MTJ stack 10 can further comprise a second layer 3. The second layer 3 can be an electrically conductive strip.

Figure 4:
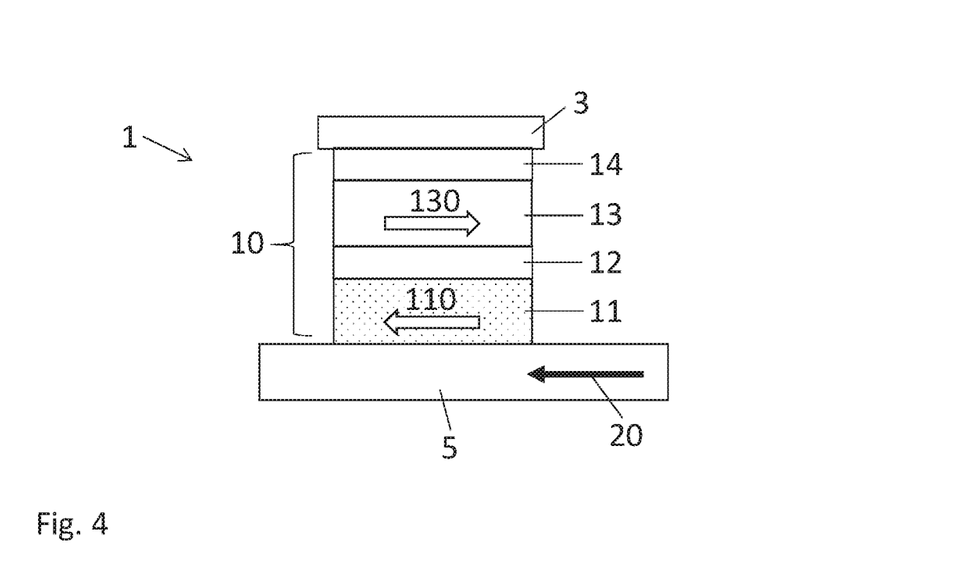
FIG. 4 shows a cross section view of a MRAM cell, according to yet another embodiment.

One or more additional layers can be comprised between the reference layer 13 and the second layer 3. In the exemplary MRAM cell 1 shown in FIG. 4, an antiferromagnetic layer 14 is added between the reference layer 13 and the second layer 3, the antiferromagnetic layer 14 exchange-coupling the reference layer 13 in order to fix the reference magnetization 130 at operational temperatures of the MRAM cell 1. In another example not represented, the MRAM cell 1 can have an additional layer between the antiferromagnetic layer 14 and the reference layer 13 that is used to control the magnitude of the exchange-coupling between the antiferromagnetic layer 14 and the reference layer 13. In another example also not represented, the MRAM cell 1 can have additional layers between the reference layer 13 and the antiferromagnetic layer 14, in order to form a synthetic antiferromagnetic arrangement.

The MRAM cell 1 arrangement of FIG. 2 can be seen as a three-terminal device wherein a write current 20 is injected through the first layer 5 (for example by applying a voltage difference at the two ends of the first layer 5). The write current 20 flows in the plane (in-plane) of the first electrode 5. A read current (not shown) can be passed in the MTJ stack 10 (for example by applying a voltage difference between the second layer 3 and the first layer 5).

An advantage of the three-terminal arrangement is that the read current path is separated from the write current path 20. Since the write current 20 does not flow perpendicularly in the MTJ stack 10, the tunnel barrier layer 12 experiences less stress.

It should be understood that FIG. 2 represents only one arrangement of the MRAM cell 1 and other configurations are also possible. For example, in FIG. 3, the MRAM cell 1 is configured in this order, from top to bottom: first layer 5, storage layer 11, tunnel barrier layer 12, reference layer 13 and second layer 3.

The first layer 5 can be formed from a substantially electrically conducting material. The first layer 5 can comprise a material having high spin-orbit coupling. Such material can comprise any one or a combination of elements selected from Ta, Pt, Pd, Au, Bi, Zn, Hf, Os, Pb, TI, W, Tb, Gd, Ho, Dy, Pr, Sm, Nd, V, Ti, Te or Ir, or any other suitable material having high spin-orbit coupling, or their oxides. Alternatively, the high spin-coupling material can comprise a low spin-orbit material such as Cu, Si, Al, Mg or C being doped with any one or a combination of the elements above, or their oxides. The high spin-coupling material can further comprise an antiferromagnetic material or a topological insulator. The antiferromagnetic material can include an alloy comprising PtMn, IrMn or PdMn, or their oxides.

In another embodiment not represented, the first layer 5 can comprise a plurality of sublayers either conductive or insulating.

Figure 5:
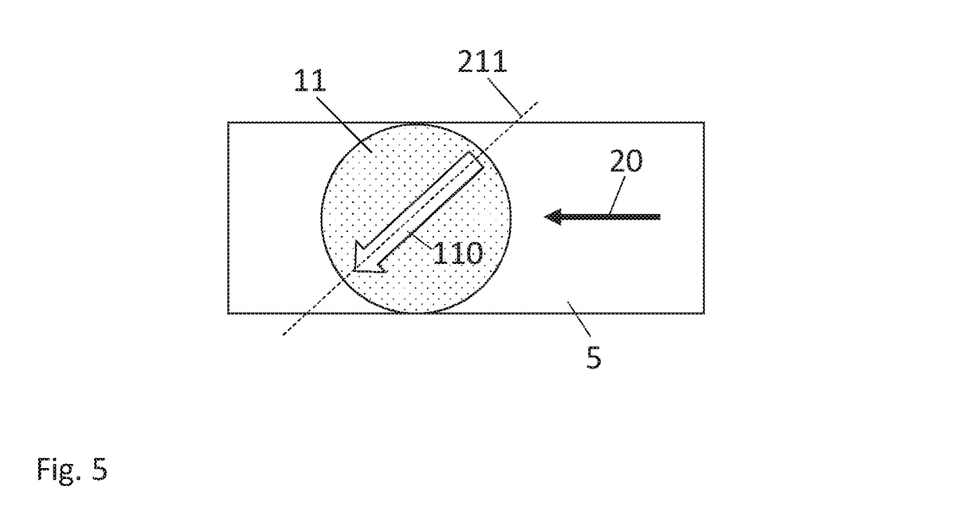
FIG. 5 shows a top view of the MRAM cell, according to an embodiment.
Figure 6:
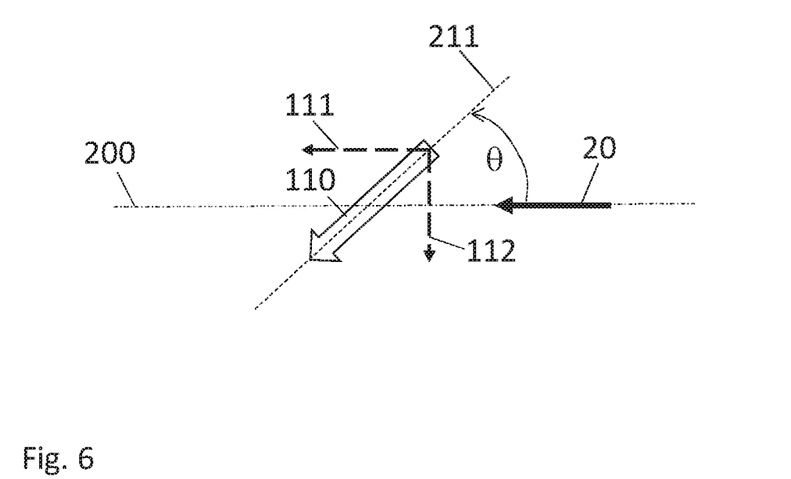
FIG. 6 represents the orientation of an in-plane uniaxial anisotropy in a storage layer of the MRAM cell, according to an embodiment.

Advantageously, the MTJ stack 10 is configured for providing an in-plane uniaxial anisotropy 211 in the storage layer 11. FIG. 5 is a top view of the MRAM cell 1 wherein the storage layer 11 and the first layer 5 are shown. FIG. 6 represents the orientation of the in-plane uniaxial anisotropy 211 relative to the write current 20. The flowing direction of the write current 20 in the first layer 5 is indicated by the line 200. The in-plane storage magnetization 110 comprises a parallel component 111 that is oriented parallel to the write current 20 flowing direction 200 and a perpendicular component 112 that is oriented perpendicular to the write current 20 flowing direction 200. The magnitude of the parallel and perpendicular components 111, 112 depends on the angle θ.

The angle θ between the in-plane uniaxial anisotropy 211 and the direction of the write current 20 being greater than 0° and smaller than, or equal to, 90° provides a symmetry-breaking factor.

In an embodiment, the in-plane uniaxial anisotropy 211 is oriented with an angle θ relative to the direction of the write current 20 that is between 5° and 90°. The in-plane uniaxial anisotropy 211 has an energy that is between 40 and 200 $k_B T$ and shows a coercivity that is larger than 200 Oe, preferably larger than 500 Oe or more preferably larger than 1000 Oe. In general, the larger the coercivity the higher is the immunity against magnetic disturbances. A coercivity value of about 200 Oe can be seen as a minimum value in order to obtain immunity against magnetic disturbances. Such value cannot be achieved relying on shape anisotropy only.

In a variant, the in-plane uniaxial anisotropy 211 makes an angle θ with the direction of the write current 20 between 10° and 90°. In a preferred embodiment, the uniaxial anisotropy 211 makes an angle θ with the direction of the write current 20 between 30° and 90°. The angle θ between 10° and 90° and more especially between 30° and 90°, provides an increased symmetry-breaking factor and this a more deterministic switching of the storage magnetization 110.

The in-plane uniaxial anisotropy 211 can be provided by the storage layer 11 comprising an in-plane uniaxial crystalline anisotropy. In a variant, the storage layer 11 can be made preferentially textured or monocrystalline for example after annealing or by special deposition means, so that the magnetocrystalline anisotropy can be enhanced. Here and in the rest of the description, the term "textured" or "texture" corresponds to a preferred crystallographic orientation induced during the deposition step of the layer (in this particular case, the storage layer).

Alternatively, the in-plane uniaxial anisotropy 211 can be provided by exchange anisotropy. In other words, the in-plane uniaxial anisotropy 211 is the result of a magnetic interaction between an antiferromagnetic material of the first layer 5 and a ferromagnetic material of the storage layer 11, resulting in an increase of the coercivity field of the storage layer 11. Here, the high spin-coupling material of the first layer 5 can comprise an antiferromagnetic material, such as PtMn, IrMn or PdMn.

Figure 7:
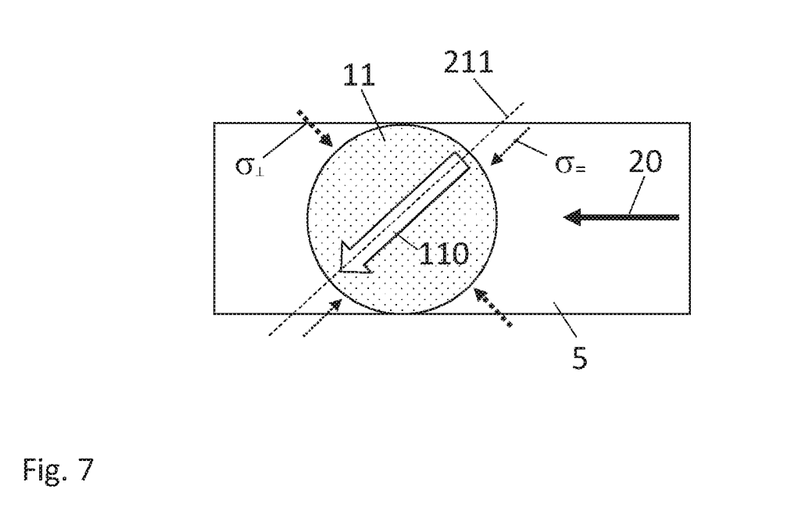
FIG. 7 shows a top view of the MRAM cell, according to another embodiment.

In yet another embodiment illustrated in FIG. 7, the in-plane uniaxial anisotropy 211 can be provided by magnetostriction induced anisotropy. To that end, the storage layer 11 can comprise a strained ferromagnetic layer. For example, during the manufacturing process of the SOT-MRAM cell 1, such ferromagnetic layer is grown anisotropically strained on the first layer 5. In another example, the storage layer 11 can comprise a ferromagnetic layer experiencing uniaxial strain upon a phase transition where such phase transition can for example be induced by a temperature treatment during the fabrication process. In yet another example, the storage layer 11 can be grown on the first layer 5. The first layer 5 can comprise a layer portion, on any side or on any part of the first layer 5, experiencing uniaxial strain upon a phase transition and where such phase transition can for example be induced by a temperature treatment during the fabrication process and transfers the strain from the first layer 5 to the storage layer 11. The anisotropic mechanical stress induced by the strained ferromagnetic storage layer 11 results in a magnetostriction induced in-plane uniaxial anisotropy 211. The mechanical stress induced in-plane uniaxial anisotropy 211 can comprise a tensile or compressive stress $\sigma_\perp$ that is applied substantially perpendicular to the direction of the in-plane uniaxial anisotropy 211, or a tensile or compressive stress $\sigma_=$ that is applied substantially parallel to the direction of the in-plane uniaxial anisotropy 211. The orientation of the in-plane uniaxial anisotropy 211 relative to the direction of the write current 20 can thus be set by a proper stress direction.

In yet another embodiment not represented, the in-plane uniaxial anisotropy 211 can be provided by oblique angle deposition techniques of the storage layer 110. For example, during the deposition process, the storage layer 11 can be deposited at oblique incidence with respect to the normal to the plane of a substrate (not shown) on which the different layers 5, 11, 12, 13 are deposited. Growth by oblique deposition results in the ferromagnetic storage layer 11 being textured with high in-plane uniaxial anisotropy. The orientation of the in-plane uniaxial anisotropy 211 relative to the direction of the write current 20 can thus be set by using a suitable set of deposition parameters and particularly by carefully setting the in-plane deposition axis direction. The deposition angle (with respect to the normal to the plane of the substrate) will be chosen between 5° and 85° and preferentially larger than 40°.

Figure 8:
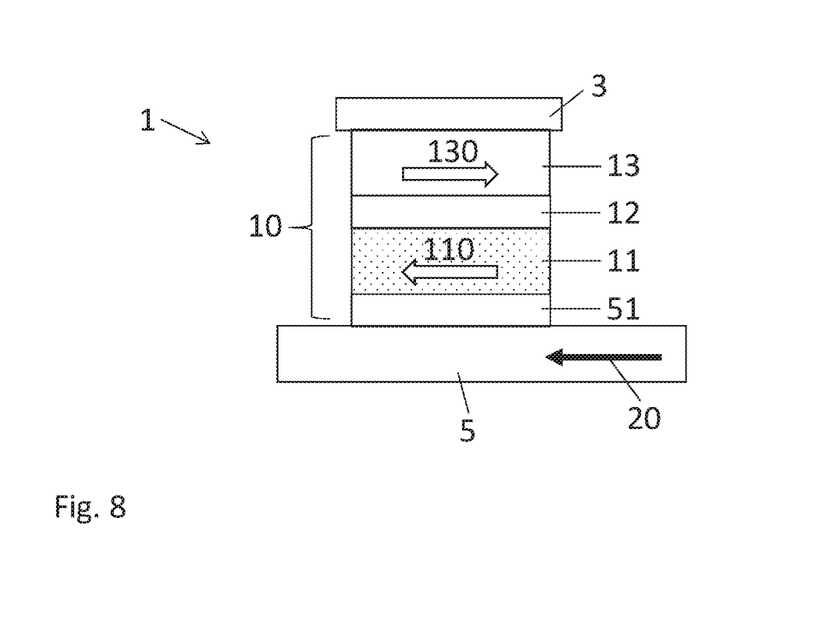
FIG. 8 shows a cross section view of a MRAM cell, according to another embodiment.

In yet another embodiment represented in FIG. 8, the in-plane uniaxial anisotropy 211 can be provided by oblique deposition techniques of a seed layer 51. For example, during the deposition process, the seed layer 51 can be deposited at oblique incidence with respect to the normal to the plane of the substrate. Growth by oblique deposition results either in the creation of a textured seed layer 51 and/or in the development of surface corrugations normal to the incident plane due to effective shadowing of the incoming depositing atoms when increasing the incidence angles. This results in the seed layer 51 comprising surface corrugations being oblique to the normal to the seed layer 51 plane. This will result in a high in-plane uniaxial anisotropy 211 of the storage layer 110. The orientation of the in-plane uniaxial anisotropy 211 relative to the direction of the write current 20 can thus be set by using a suitable set of deposition parameters and particularly by carefully setting the in-plane deposition axis direction. The deposition angle (with respect to the normal to the plane of the substrate) will be chosen between 5° and 85° and preferentially larger than 40°.

Figure 9:
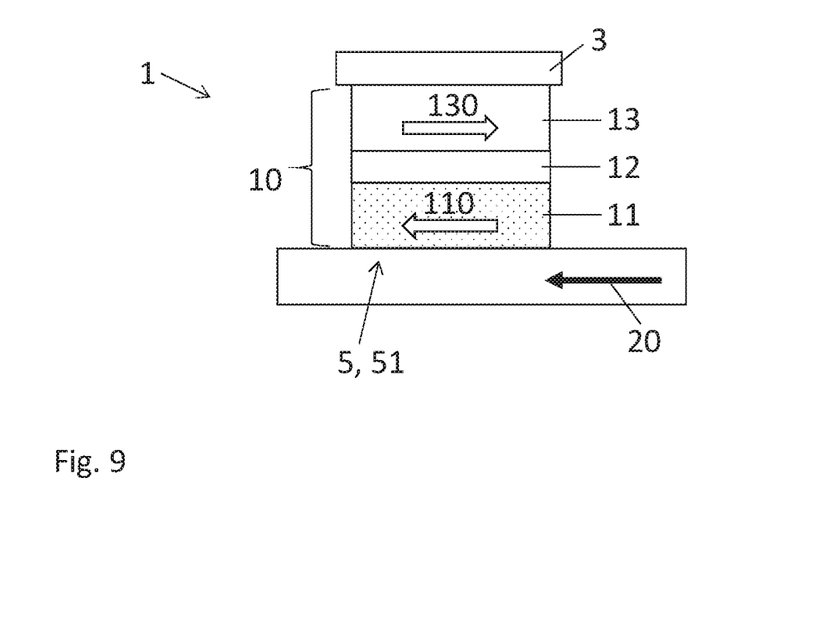
FIG. 9 shows a cross section view of a MRAM cell, according to yet another embodiment.

In embodiment variant represented in FIG. 9, the seed layer 51 is comprised in the first layer 5. For example, the seed layer 51 can be a sublayer of the first layer 5, that can comprise more sublayers. The seed layer 51 and the first layer 5 can form a single layer.

In yet another embodiment not represented, the in-plane uniaxial anisotropy 211 can be provided by the storage layer 11 being textured, for example by using an oblique deposition technique applied during the deposition of both the seed layer 51 and the storage layer 11.

In yet another embodiment not represented, the in-plane uniaxial anisotropy 211 can be provided by a patterned substrate on which the seed layer 51 is deposited. This substrate can be for example patterned by nanofabrication techniques or be a vicinal substrate. Here and in the rest of the description, the term "patterned" corresponds to a layer undergoing a fabrication process to change its properties (including its crystallographic texture) after the layer has been deposited. For instance, patterns such as nano grooves can be provided. Growth on such a patterned substrate results in the creation of a textured ferromagnetic storage layer 11 with high in-plane uniaxial anisotropy. Any orientation of the in-plane uniaxial anisotropy 211 can be set providing the adequate texture is beforehand patterned. Thus, the orientation of the in-plane uniaxial anisotropy 211 relative to the direction of the write current 20 can thus be set by producing the adequate pattern on the substrate. The patterned structures have an average amplitude lower than 2 nm and preferentially lower than 0.5 nm.

In yet another embodiment not represented, the in-plane uniaxial anisotropy 211 can be provided by the seed layer 51 being patterned. This seed layer 51 can be for example patterned by nanofabrication techniques. For instance, patterns such as nano grooves can be produced. Growth on such a patterned seed layer 51 results in the creation of a textured magnetic material with high in-plane uniaxial anisotropy. Any orientation of the in-plane uniaxial anisotropy 211 can be set providing the adequate texture is beforehand patterned. Thus, the orientation of the in-plane uniaxial anisotropy 211 relative to the direction of the write current 20 can thus be set by producing the adequate pattern on the substrate. The patterned structures have an average amplitude lower than 2 nm and preferentially lower than 0.5 nm.

In yet another embodiment not represented, the in-plane uniaxial anisotropy 211 can be provided by patterning both the substrate and the seed layer 51, i.e., the MTJ stack 10 comprises a patterned substrate and a patterned seed layer 51. The patterned structures have an average amplitude lower than 2 nm and preferentially lower than 0.5 nm.

The in-plane uniaxial anisotropy 211 can be provided by a combination of: the storage layer 11 comprising an in-plane uniaxial crystalline anisotropy, by exchange anisotropy, patterning the substrate, patterning the seed layer 51 or by magnetostriction induced anisotropy.

The storage magnetization 110 is oriented in the plane of the storage layer 11, rotated from the write current 20 direction with a finite non-zero angle θ, such that the switching of the storage magnetization 110 by the spin orbit torque effect generated by the write current 20 allows for both fast and deterministic switching.

The storage magnetization 110 configuration further provides a strong magnetic anisotropy such that retention and high coercivity (larger than 200 Oe, preferably larger than 500 Oe or more preferably larger than 1000 Oe) are also achieved. The in-plane uniaxial anisotropy 211, along with the storage magnetization 110, can be configured to be large enough such as to ensure sufficient data retention of the MRAM cell 1 from seconds to years, preferably from 1 month to 10 years.

The disclosed MRAM cell 1 allows for stable magnetic written states, even when the storage layer 11 possesses no shape anisotropy.

REFERENCE NUMBERS AND SYMBOLS 1 magnetic memory cell
10 magnetic tunnel junction
11 storage layer
110 storage magnetization
111 parallel component
112 perpendicular component
12 tunnel barrier layer
13 reference layer
130 reference magnetization
14 antiferromagnet layer 20 write current
200 flowing direction of the current
211 uniaxial crystalline anisotropy
3 second layer
5 SOT generating layer, bottom electrode, first layer
51 seed layer
θ angle
σ mechanical stress
$\sigma_\perp$ stress perpendicular to the anisotropy axis
$\sigma_=$ stress parallel to the anisotropy axis

The invention claimed is:

1. A magnetic memory (MRAM) cell, comprising:
a first layer formed from a substantially electrically conductive material and configured for passing a write current; and
a magnetic tunnel junction (MTJ) stack formed over the first layer, wherein the MTJ stack comprises:
a ferromagnetic reference layer having an in-plane reference magnetization;
a tunnel barrier layer; and
a ferromagnetic storage layer between the tunnel barrier layer and the first layer, the storage layer having an in-plane storage magnetization;
wherein the MTJ stack is configured for providing an in-plane uniaxial anisotropy in the storage layer;
said in-plane uniaxial anisotropy making an angle relative to the direction of the write current that is between 5° and 90°, and
said in-plane uniaxial anisotropy having an energy between 40 and 200 $k_BT$ and a coercivity larger than 200 Oe.

2. The MRAM cell according to claim 1, wherein the storage layer comprises a crystalline anisotropy to provide said in-plane uniaxial anisotropy.

3. The MRAM cell according to claim 1, wherein the first layer comprises an antiferromagnetic material, and wherein the in-plane uniaxial anisotropy results from a magnetic interaction between an antiferromagnetic material of the first layer and the ferromagnetic storage layer.

4. The MRAM cell according to claim 1, wherein the ferromagnetic storage layer is strained, the orientation of the in-plane uniaxial anisotropy being determined by the stress direction of the strained ferromagnetic storage layer.

5. The MRAM cell according to claim 1, wherein the storage layer is textured with in-plane uni axial anisotropy.

6. The MRAM cell according to claim 1, wherein the MTJ stack comprises a seed layer on which the storage layer is deposited; and
wherein the in-plane uniaxial anisotropy is provided by the seed layer being textured and/or comprising surface corrugations being oblique to the normal to the seed layer plane, by depositing the seed layer using an oblique angle deposition technique and depositing the storage layer on the seed layer.

7. The MRAM cell according to claim 6, wherein the in-plane uniaxial anisotropy is further provided by the storage layer being textured, by depositing the storage layer using an oblique angle deposition technique.

8. The MRAM cell according to claim 1, wherein the MTJ stack comprises a seed layer on which the storage layer is deposited; and
wherein the in-plane uniaxial anisotropy is provided by a patterned substrate on which the seed layer is deposited.

9. The MRAM cell according to claim 1, wherein the MTJ stack comprises a seed layer on which the storage layer is deposited; and
wherein the in-plane uniaxial anisotropy is provided by the seed layer being pattern.

10. The MRAM cell according to claim 9, wherein the in-plane uniaxial anisotropy is further provided by a pattern substrate on which the seed layer is deposited.

11. The MRAM cell according to claim 9, wherein said pattern substrate comprises structures having an average amplitude lower than 2 nm and preferentially lower than 0.5 nm.

12. The MRAM cell according to claim 1, wherein the angle is between 30° and 90°.

13. The MRAM cell according to claim 1, wherein said coercivity is larger than 500 Oe or more preferably larger than 1000 Oe.

* * * * *